US011133133B2

(12) United States Patent
Hansen

(10) Patent No.: US 11,133,133 B2
(45) Date of Patent: Sep. 28, 2021

(54) SUPERCAPACITOR MODULE HAVING MATCHED SUPERCAPACITORS

(71) Applicant: AVX Corporation, Fountain Inn, SC (US)

(72) Inventor: Shawn Hansen, Simpsonville, SC (US)

(73) Assignee: AVX Corporation, Fountain Inn, SC (US)

( * ) Notice: Subject to any disclaimer, the term of this patent is extended or adjusted under 35 U.S.C. 154(b) by 73 days.

(21) Appl. No.: 16/123,007

(22) Filed: Sep. 6, 2018

(65) Prior Publication Data

US 2019/0074710 A1 Mar. 7, 2019

Related U.S. Application Data

(60) Provisional application No. 62/555,098, filed on Sep. 7, 2017.

(51) Int. Cl.
*H01G 11/10* (2013.01)
*H01G 11/14* (2013.01)
*H01G 11/84* (2013.01)
*H01G 11/82* (2013.01)
*G01R 31/64* (2020.01)

(52) U.S. Cl.
CPC ............ *H01G 11/10* (2013.01); *H01G 11/14* (2013.01); *H01G 11/84* (2013.01); *G01R 31/64* (2020.01); *H01G 11/82* (2013.01)

(58) Field of Classification Search
CPC .................... H01G 11/10; H01G 11/12
See application file for complete search history.

(56) References Cited

U.S. PATENT DOCUMENTS

| 4,803,597 A * | 2/1989 | Watanabe | H01G 11/28 361/502 |
| 4,992,910 A * | 2/1991 | Evans | H01G 9/12 361/502 |
| 6,487,066 B1 * | 11/2002 | Niiori | H01G 9/155 361/502 |
| 7,633,284 B2 | 12/2009 | Ingram et al. | |
| 8,116,044 B2 | 2/2012 | Pelc et al. | |

(Continued)

FOREIGN PATENT DOCUMENTS

WO WO2013126915 8/2013

OTHER PUBLICATIONS

Maxwell Technologies, Data Sheet, 2.7 V 650—3000F Ultracapacitor Cells, No date.*

(Continued)

*Primary Examiner* — Eric W Thomas
(74) *Attorney, Agent, or Firm* — Dority & Manning, P.A.

(57) ABSTRACT

A supercapacitor module is provided. In some implementations, the supercapacitor module may include a first supercapacitor having a first parameter value for a capacitor parameter in a first test condition. The supercapacitor module may include a second supercapacitor having a second parameter value for the capacitor parameter in about the first test condition. A ratio of the second parameter value to the first parameter value may be from about 0.8 to about 1.2. The supercapacitor module may prevent overvoltages across the first and second supercapacitors, such that the supercapacitor module may satisfactorily operate without a balancing circuit.

22 Claims, 8 Drawing Sheets

(56) References Cited

U.S. PATENT DOCUMENTS

| | | | |
|---|---|---|---|
| 9,472,353 B2 | 10/2016 | Gadkaree et al. | |
| 2004/0252443 A1* | 12/2004 | Farahmandi | H01G 9/155 |
| | | | 361/502 |
| 2007/0053140 A1* | 3/2007 | Soliz | H01G 9/26 |
| | | | 361/502 |
| 2008/0218938 A1 | 9/2008 | Kazaryan et al. | |
| 2010/0134940 A1* | 6/2010 | Nguyen | H01G 9/155 |
| | | | 361/91.1 |
| 2012/0050946 A1 | 3/2012 | Ra et al. | |
| 2012/0087060 A1 | 4/2012 | Ra et al. | |
| 2012/0268074 A1* | 10/2012 | Cooley | H01G 11/08 |
| | | | 320/130 |
| 2013/0215535 A1* | 8/2013 | Bellomo | H02H 7/16 |
| | | | 361/16 |
| 2014/0098463 A1 | 4/2014 | Bendale et al. | |
| 2016/0061877 A1 | 3/2016 | Marshall et al. | |

OTHER PUBLICATIONS

Product Information—"New 6.0V SCM Series Supercapacitors Modules—Connected Supercapacitors," AVX Corporation, 071117, 8 pages.

Product Information—"AVX Supercapacitors Comparison Matrix," AVX Corporation, 3 pages.

International Search Report and Written Opinion for PCT/US2018/049671 dated Jan. 4, 2019, 10 pages.

European Search Report for EP18854609.7 dated Apr. 16, 2021, 7 pages.

* cited by examiner

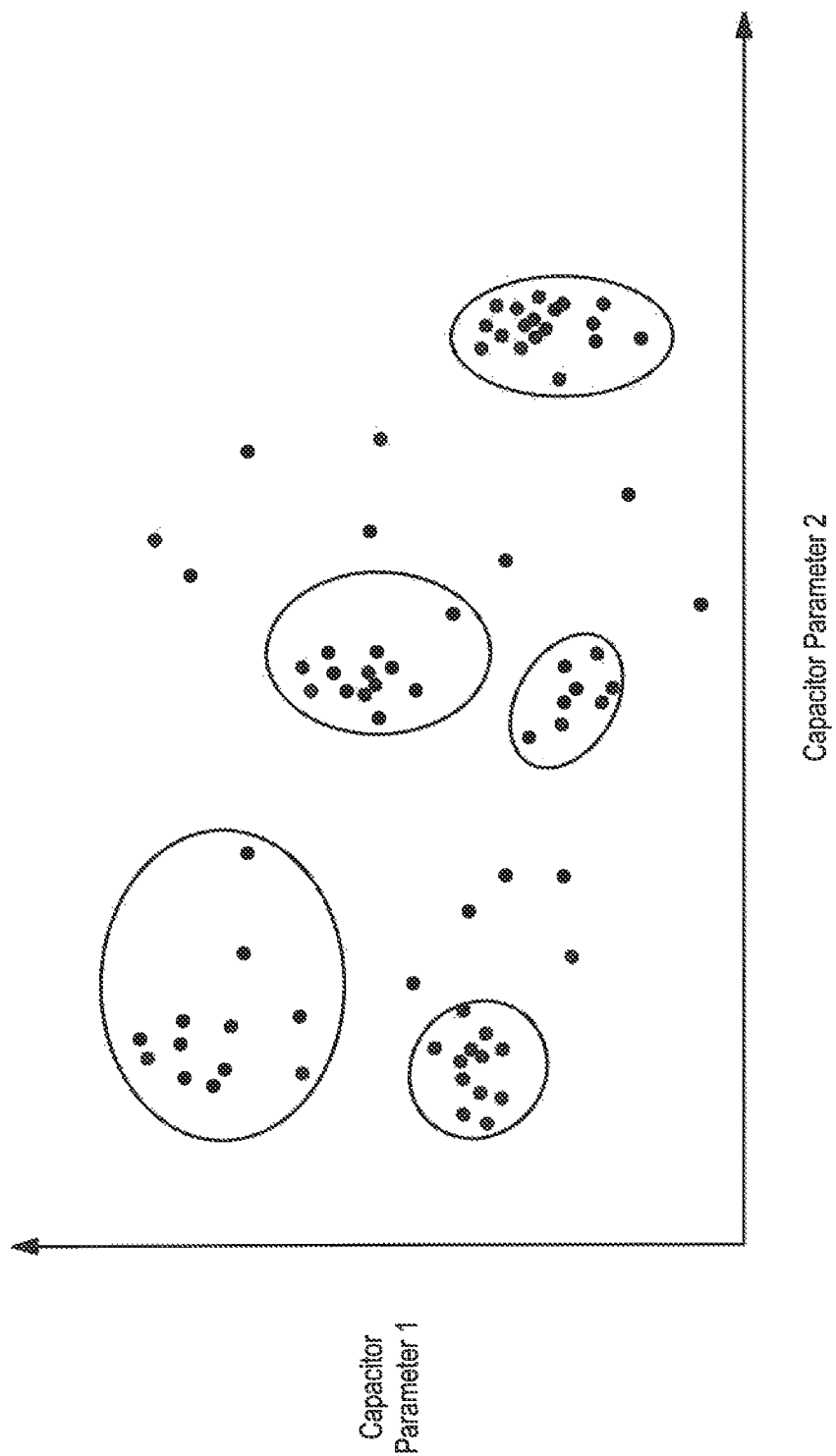

SUPERCAPACITOR MODULE HAVING MATCHED SUPERCAPACITORS

CROSS REFERENCE TO RELATED APPLICATION

The present application claims filing benefit of U.S. Provisional Patent Application Ser. No. 62/555,098 having a filing date of Sep. 7, 2017, which is incorporated herein by reference in its entirety.

BACKGROUND OF THE INVENTION

Electrical energy storage cells are widely used to provide power to electronic, electromechanical, electrochemical, and other useful devices. A double layer supercapacitor, for instance, can employ a pair of polarizable electrodes that contain carbon particles (e.g., activated carbon) impregnated with a liquid electrolyte. Due to the effective surface area of the particles and the small spacing between the electrodes, large capacitance values can be achieved. The individual double layer capacitors may be combined together to form a module having a raised output voltage or increased energy capacity.

The performance and longevity of supercapacitor modules are dependent on the voltages across each supercapacitor of the module. For example, a voltage exceeding the rated voltage of a supercapacitor, referred to as an "overvoltage," may reduce the performance and/or longevity of the module. To prevent overvoltages, supercapacitor modules typically include balancing circuits to regulate the voltages across the supercapacitors in the module. For example, the balancing circuit may be designed to maintain approximately equal voltages across each of the supercapacitors in the module.

The use of balancing circuits in supercapacitor modules, however, may undesirably increase the size, cost, and/or complexity of the module. Balancing circuits may additionally produce desirable heat, which may require cooling of the module, further adding to the cost and/or complexity of the module and increasing the potential for heat-caused damage of failure.

SUMMARY

In accordance with one embodiment, a capacitor module is disclosed which comprises a first supercapacitor having a first parameter value for a capacitor parameter in a first test condition. The capacitor module comprises a second supercapacitor having a second parameter value for the capacitor parameter in about the first test condition. A ratio of the second parameter value to the first parameter value may be from 0.8 to 1.2.

Other features and aspects of the present disclosure are set forth in greater detail below.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figure in which:

FIG. 6 illustrates a hypothetical example of selecting supercapacitors using a clustering algorithm and/or machine learning algorithm;

Figure 1:
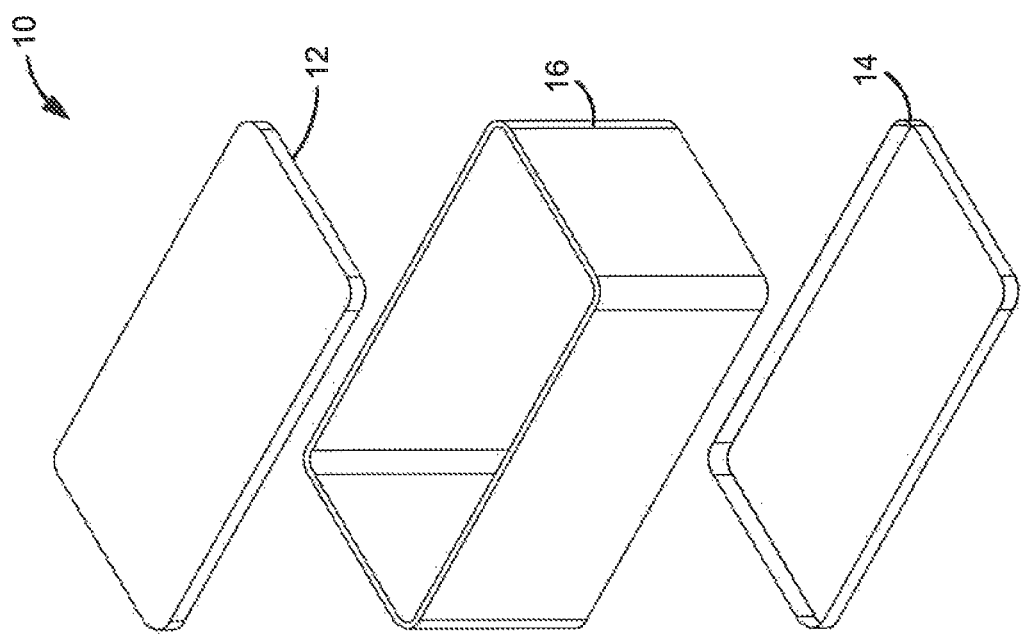
FIG. 1 is an exploded view of one embodiment of a module housing that may be employed to house the module of the present invention.

Repeat use of reference characters in the present specification and drawing is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Supercapacitor modules typically include balancing circuits to control the respective voltages across each supercapacitor of a module to prevent overvoltages, as indicated above. Some balancing circuits may be active, such an integrated circuit, for example. Other balancing circuits may be passive, such as one or more passive components, e.g., resistors, capacitors, etc., connecting the terminals of the supercapacitors.

By matching the supercapacitors as described herein, the need for a balancing circuit may be eliminated. For example, by selecting supercapacitors having similar properties as described herein, the module may operate with approximately equal respective voltages across each supercapacitor. In some embodiments, this may prevent overvoltages from occurring within the module and effectively eliminate the need for a balancing circuit entirely. In other embodiments, a simple passive balancing circuit may be used instead of an active balancing circuit.

Eliminating a balancing circuit from the module may result in smaller, less expensive, less costly, and/or less complex modules. Moreover, eliminating the need for a balancing circuit may reduce the amount of heat produced by the module during operation. In turn, this may eliminate the need for a cooling system and generally result in a more robust and reliable module which is less prone to damage or failure from overheating.

I. Supercapacitor Module Configuration

With reference to FIG. 1, in one embodiment, a module housing 10 may include a top surface 12, a bottom surface 14, and a side surface 16 extending between the top surface 12 and the bottom surface 14. In this regard, the supercapacitors (shown in FIG. 2), may be contained between the top surface 14 and the bottom surface 14 of the module housing 10. In addition, the module housing 30 may also include external terminals or connections (not shown) for use and connection to a device.

Figure 2:
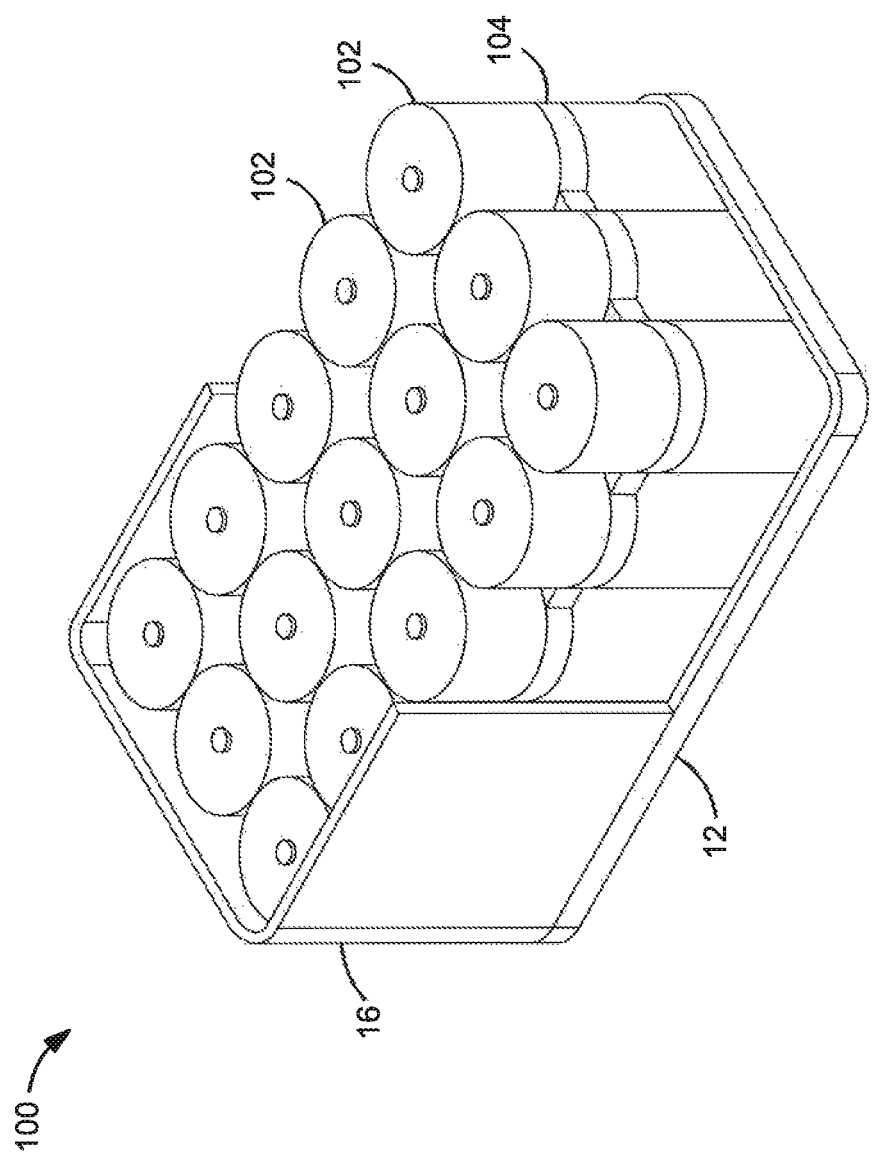
FIG. 2 is a perspective view of a supercapacitor module in accordance with one embodiment of the present invention.

Referring to FIG. 2, a capacitor module 100 may include a plurality of supercapacitors 102 disposed within the module housing 10. As indicated herein, it should be understood that the module 100 may contain more than two supercapacitors. For example, the module may contain two supercapacitors, and, in some embodiments, may contain more than two supercapacitors, such as four or more, such as six or more, such as eight or more, and in some embodiments, from eight to thirty individual supercapacitors. For instance, in one embodiment, the module may contain fifteen supercapacitors, as illustrated in FIG. 2.

The module may include support structure 104 configured to secure the supercapacitors within the housing 10. It should be appreciated that the module configuration illustrated herein is merely an example. Any suitable module configuration may be used. For example, in some embodiments, the supercapacitors may be stacked end to end. In some embodiments, instead of the housing 10 illustrated in FIG. 2, the housing include a thin wrapper, for example.

II. Supercapacitor Configuration

Any of a variety of different individual supercapacitors may generally be employed in the module of the present invention. Generally speaking, however, the supercapacitor contains an electrode assembly and electrolyte contained and optionally hermetically sealed within a housing. The electrode assembly may, for instance, contain a first electrode that contains a first carbonaceous coating (e.g., activated carbon particles) electrically coupled to a first current collector, and a second electrode that contains a second carbonaceous coating (e.g., activated carbon particles) electrically coupled to a second current collector. It should be understood that additional current collectors may also be employed if desired, particularly if the supercapacitor includes multiple energy storage cells. The current collectors may be formed from the same or different materials. Regardless, each collector is typically formed from a substrate that includes a conductive metal, such as aluminum, stainless steel, nickel, silver, palladium, etc., as well as alloys thereof. Aluminum and aluminum alloys are particularly suitable for use in the present invention. The substrate may be in the form of a foil, sheet, plate, mesh, etc. The substrate may also have a relatively small thickness, such as about 200 micrometers or less, in some embodiments from about 1 to about 100 micrometers, in some embodiments from about 5 to about 80 micrometers, and in some embodiments, from about 10 to about 50 micrometers. Although by no means required, the surface of the substrate may be optionally roughened, such as by washing, etching, blasting, etc. The use of the term "about" in conjunction with a numerical value is intended to refer to within 20% of the stated amount.

First and second carbonaceous coatings may also be electrically coupled to the first and second current collectors, respectively. While they may be formed from the same or different types of materials and may contain one or multiple layers, each of the carbonaceous coatings generally contains at least one layer that includes activated particles. In certain embodiments, for instance, the activated carbon layer may be directly positioned over the current collector and may optionally be the only layer of the carbonaceous coating. Examples of suitable activated carbon particles may include, for instance, coconut shell-based activated carbon, petroleum coke-based activated carbon, pitch-based activated carbon, polyvinylidene chloride-based activated carbon, phenolic resin-based activated carbon, polyacrylonitrile-based activated carbon, and activated carbon from natural sources such as coal, charcoal or other natural organic sources.

In certain embodiments, it may be desired to selectively control certain aspects of the activated carbon particles, such as their particle size distribution, surface area, and pore size distribution to help improve ion mobility for certain types of electrolytes after being subjected to one or more charge-discharge cycles. For example, at least 50% by volume of the particles (D50 size) may have a size in the range of from about 0.01 to about 30 micrometers, in some embodiments from about 0.1 to about 20 micrometers, and in some embodiments, from about 0.5 to about 10 micrometers. At least 90% by volume of the particles (D90 size) may likewise have a size in the range of from about 2 to about 40 micrometers, in some embodiments from about 5 to about 30 micrometers, and in some embodiments, from about 6 to about 15 micrometers. The BET surface may also range from about 900 $m^2/g$ to about 3,000 $m^2/g$, in some embodiments from about 1,000 $m^2/g$ to about 2,500 $m^2/g$, and in some embodiments, from about 1,100 $m^2/g$ to about 1,800 $m^2/g$.

In addition to having a certain size and surface area, the activated carbon particles may also contain pores having a certain size distribution. For example, the amount of pores less than about 2 nanometers in size (i.e., "micropores") may provide a pore volume of about 50 vol. % or less, in some embodiments about 30 vol. % or less, and in some embodiments, from 0.1 vol. % to 15 vol. % of the total pore volume. The amount of pores between about 2 nanometers and about 50 nanometers in size (i.e., "mesopores") may likewise be from about 20 vol. % to about 80 vol. %, in some embodiments from about 25 vol. % to about 75 vol. %, and in some embodiments, from about 35 vol. % to about 65 vol. %. Finally, the amount of pores greater than about 50 nanometers in size (i.e., "macropores") may be from about 1 vol. % to about 50 vol. %, in some embodiments from about 5 vol. % to about 40 vol. %, and in some embodiments, from about 10 vol. % to about 35 vol. %. The total pore volume of the carbon particles may be in the range of from about 0.2 $cm^3/g$ to about 1.5 $cm^3/g$, and in some embodiments, from about 0.4 $cm^3/g$ to about 1.0 $cm^3/g$, and the median pore width may be about 8 nanometers or less, in some embodiments from about 1 to about 5 nanometers, and in some embodiments, from about 2 to about 4 nanometers. The pore sizes and total pore volume may be measured using nitrogen adsorption and analyzed by the Barrett-Joyner-Halenda ("BJH") technique as is well known in the art.

If desired, binders may be present in an amount of about 60 parts or less, in some embodiments 40 parts or less, and in some embodiments, from about 1 to about 25 parts per 100 parts of carbon in the first and/or second carbonaceous coatings. Binders may, for example, constitute about 15 wt. % or less, in some embodiments about 10 wt. % or less, and in some embodiments, from about 0.5 wt. % to about 5 wt. % of the total weight of a carbonaceous coating. Any of a variety of suitable binders can be used in the electrodes. For instance, water-insoluble organic binders may be employed in certain embodiments, such as styrene-butadiene copolymers, polyvinyl acetate homopolymers, vinyl-acetate ethylene copolymers, vinyl-acetate acrylic copolymers, ethylene-vinyl chloride copolymers, ethylene-vinyl chloride-vinyl acetate terpolymers, acrylic polyvinyl chloride polymers, acrylic polymers, nitrile polymers, fluoropolymers such as polytetrafluoroethylene or polyvinylidene fluoride, polyolefins, etc., as well as mixtures thereof. Water-soluble organic binders may also be employed, such as polysaccharides and derivatives thereof. In one particular embodiment, the polysaccharide may be a nonionic cellulosic ether, such as alkyl cellulose ethers (e.g., methyl cellulose and ethyl cellulose);

hydroxyalkyl cellulose ethers (e.g., hydroxyethyl cellulose, hydroxypropyl cellulose, hydroxypropyl hydroxybutyl cellulose, hydroxyethyl hydroxypropyl cellulose, hydroxyethyl hydroxybutyl cellulose, hydroxypropyl hydroxypropyl hydroxybutyl cellulose, etc.); alkyl hydroxyalkyl cellulose ethers (e.g., methyl hydroxyethyl cellulose, methyl hydroxypropyl cellulose, ethyl hydroxyethyl cellulose, ethyl hydroxypropyl cellulose, methyl ethyl hydroxyethyl cellulose and methyl ethyl hydroxypropyl cellulose); carboxyalkyl cellulose ethers (e.g., carboxymethyl cellulose); and so forth, as well as protonated salts of any of the foregoing, such as sodium carboxymethyl cellulose.

Other materials may also be employed within an activated carbon layer of the first and/or second carbonaceous coatings and/or within other layers of the first and/or second carbonaceous coatings. For example, in certain embodiments, a conductivity promoter may be employed to further increase electrical conductivity. Exemplary conductivity promoters may include, for instance, carbon black, graphite (natural or artificial), graphite, carbon nanotubes, nanowires or nanotubes, metal fibers, graphenes, etc., as well as mixtures thereof. Carbon black is particularly suitable. When employed, conductivity promoters typically constitute about 60 parts or less, in some embodiments 40 parts or less, and in some embodiments, from about 1 to about 25 parts per 100 parts of the activated carbon particles in a carbonaceous coating. Conductivity promotes may, for example, constitute about 15 wt. % or less, in some embodiments about 10 wt. % or less, and in some embodiments, from about 0.5 wt. % to about 5 wt. % of the total weight of a carbonaceous coating. Activated carbon particles likewise typically constitute 85 wt. % or more, in some embodiments about 90 wt. % or more, and in some embodiments, from about 95 wt. % to about 99.5 wt. % of a carbonaceous coating.

The particular manner in which a carbonaceous coating is applied to a current collector may vary as is well known to those skilled in the art, such as printing (e.g., rotogravure), spraying, slot-die coating, drop-coating, dip-coating, etc. Regardless of the manner in which it is applied, the resulting electrode is typically dried to remove moisture from the coating, such as at a temperature of about 100° C. or more, in some embodiments about 200° C. or more, and in some embodiments, from about 300° C. to about 500° C. The electrode may also be compressed (e.g., calendered) to optimize the volumetric efficiency of the supercapacitor. After any optional compression, the thickness of each carbonaceous coating may generally vary based on the desired electrical performance and operating range of the supercapacitor. Typically, however, the thickness of a coating is from about 20 to about 200 micrometers, 30 to about 150 micrometers, and in some embodiments, from about 40 to about 100 micrometers. Coatings may be present on one or both sides of a current collector. Regardless, the thickness of the overall electrode (including the current collector and the carbonaceous coating(s) after optional compression) is typically within a range of from about 20 to about 350 micrometers, in some embodiments from about 30 to about 300 micrometers, and in some embodiments, from about 50 to about 250 micrometers.

The electrode assembly also typically contains a separator that is positioned between the first and second electrodes. If desired, other separators may also be employed in the electrode assembly. For example, one or more separators may be positioned over the first electrode, the second electrode, or both. The separators enable electrical isolation of one electrode from another to help prevent an electrical short, but still allow transport of ions between the two electrodes. In certain embodiments, for example, a separator may be employed that includes a cellulosic fibrous material (e.g., airlaid paper web, wet-laid paper web, etc.), nonwoven fibrous material (e.g., polyolefin nonwoven webs), woven fabrics, film (e.g., polyolefin film), etc. Cellulosic fibrous materials are particularly suitable for use in the supercapacitor, such as those containing natural fibers, synthetic fibers, etc. Specific examples of suitable cellulosic fibers for use in the separator may include, for instance, hardwood pulp fibers, softwood pulp fibers, rayon fibers, regenerated cellulosic fibers, etc. Regardless of the particular materials employed, the separator typically has a thickness of from about 5 to about 150 micrometers, in some embodiments from about 10 to about 100 micrometers, and in some embodiments, from about 20 to about 80 micrometers.

The manner in which the components of the electrode assembly are combined together may vary as is known in the art. For example, the electrodes and separator may be initially folded, wound, or otherwise contacted together to form an electrode assembly. In one particular embodiment, the electrodes, separator, and optional electrolyte may be wound into an electrode assembly having a "jelly-roll" configuration.

To form a supercapacitor, an electrolyte is placed into ionic contact with the first electrode and the second electrode before, during, and/or after the electrodes and separator are combined together to form the electrode assembly. The electrolyte is generally nonaqueous in nature and thus contains at least one nonaqueous solvent. To help extend the operating temperature range of the supercapacitor, it is typically desired that the nonaqueous solvent have a relatively high boiling temperature, such as about 150° C. or more, in some embodiments about 200° C. or more, and in some embodiments, from about 220° C. to about 300° C. Particularly suitable high boiling point solvents may include, for instance, cyclic carbonate solvents, such as ethylene carbonate, propylene carbonate, butylene carbonate, vinylene carbonate, etc. Of course, other nonaqueous solvents may also be employed, either alone or in combination with a cyclic carbonate solvent. Examples of such solvents may include, for instance, open-chain carbonates (e.g., dimethyl carbonate, ethyl methyl carbonate, diethyl carbonate, etc.), aliphatic monocarboxylates (e.g., methyl acetate, methyl propionate, etc.), lactone solvents (e.g., butyrolactone valerolactone, etc.), nitriles (e.g., acetonitrile, glutaronitrile, adiponitrile, methoxyacetonitrile, 3-methoxypropionitrile, etc.), amides (e.g., N,N-dimethylformamide, N,N-diethylacetamide, N-methylpyrrolidinone), alkanes (e.g., nitromethane, nitroethane, etc.), sulfur compounds (e.g., sulfolane, dimethyl sulfoxide, etc.); and so forth.

The electrolyte may also contain at least one ionic liquid, which is dissolved in the nonaqueous solvent. While the concentration of the ionic liquid can vary, it is typically desired that the ionic liquid is present at a relatively high concentration. For example, the ionic liquid may be present in an amount of about 0.8 moles per liter (M) of the electrolyte or more, in some embodiments about 1.0 M or more, in some embodiments about 1.2 M or more, and in some embodiments, from about 1.3 to about 1.8 M.

The ionic liquid is generally a salt having a relatively low melting temperature, such as about 400° C. or less, in some embodiments about 350° C. or less, in some embodiments from about 1° C. to about 100° C., and in some embodiments, from about 5° C. to about 50° C. The salt contains a cationic species and counterion. The cationic species contains a compound having at least one heteroatom (e.g., nitrogen or phosphorous) as a "cationic center." Examples of such heteroatomic compounds include, for instance, unsubstituted or substituted organoquaternary ammonium compounds, such as ammonium (e.g., trimethylammonium, tetraethylammonium, etc.), pyridinium, pyridazinium, pyramidinium, pyrazinium, imidazolium, pyrazolium, oxazolium, triazolium, thiazolium, quinolinium, piperidinium, pyrrolidinium, quaternary ammonium spiro compounds in which two or more rings are connected together by a spiro atom (e.g., carbon, heteroatom, etc.), quaternary ammonium fused ring structures (e.g., quinolinium, isoquinolinium, etc.), and so forth. In one particular embodiment, for example, the cationic species may be an N-spirobicyclic compound, such as symmetrical or asymmetrical N-spirobicyclic compounds having cyclic rings. One example of such a compound has the following structure:

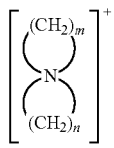

wherein m and n are independently a number from 3 to 7, and in some embodiments, from 4 to 5 (e.g., pyrrolidinium or piperidinium).

Suitable counterions for the cationic species may likewise include halogens (e.g., chloride, bromide, iodide, etc.); sulfates or sulfonates (e.g., methyl sulfate, ethyl sulfate, butyl sulfate, hexyl sulfate, octyl sulfate, hydrogen sulfate, methane sulfonate, dodecylbenzene sulfonate, dodecylsulfate, trifluoromethane sulfonate, heptadecafluorooctanesulfonate, sodium dodecylethoxysulfate, etc.); sulfosuccinates; amides (e.g., dicyanamide); imides (e.g., bis(pentafluoroethyl-sulfonyl)imide, bis(trifluoromethylsulfonyl)imide, bis(trifluoromethyl)imide, etc.); borates (e.g., tetrafluoroborate, tetracyanoborate, bis[oxalato]borate, bis[salicylato]borate, etc.); phosphates or phosphinates (e.g., hexafluorophosphate, diethylphosphate, bis(pentafluoroethyl)phosphinate, tris(pentafluoroethyl)-trifluorophosphate, tris(nonafluorobutyl)trifluorophosphate, etc.); antimonates (e.g., hexafluoroantimonate); aluminates (e.g., tetrachloroaluminate); fatty acid carboxylates (e.g., oleate, isostearate, pentadecafluorooctanoate, etc.); cyanates; acetates; and so forth, as well as combinations of any of the foregoing.

Several examples of suitable ionic liquids may include, for instance, spiro-(1,1')-bipyrrolidinium tetrafluoroborate, triethylmethyl ammonium tetrafluoroborate, tetraethyl ammonium tetrafluoroborate, spiro-(1,1')-bipyrrolidinium iodide, triethylmethyl ammonium iodide, tetraethyl ammonium iodide, methyltriethylammonium tetrafluoroborate, tetrabutylammonium tetrafluoroborate, tetraethylammonium hexafluorophosphate, etc.

As noted above, the supercapacitor also contains a housing within which the electrode assembly and electrolyte are retained and optionally hermetically sealed. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable for use in the present invention. The metal container may have any of a variety of different shapes, such as cylindrical, D-shaped, etc. Cylindrically-shaped containers are particular suitable.

Figure 3:
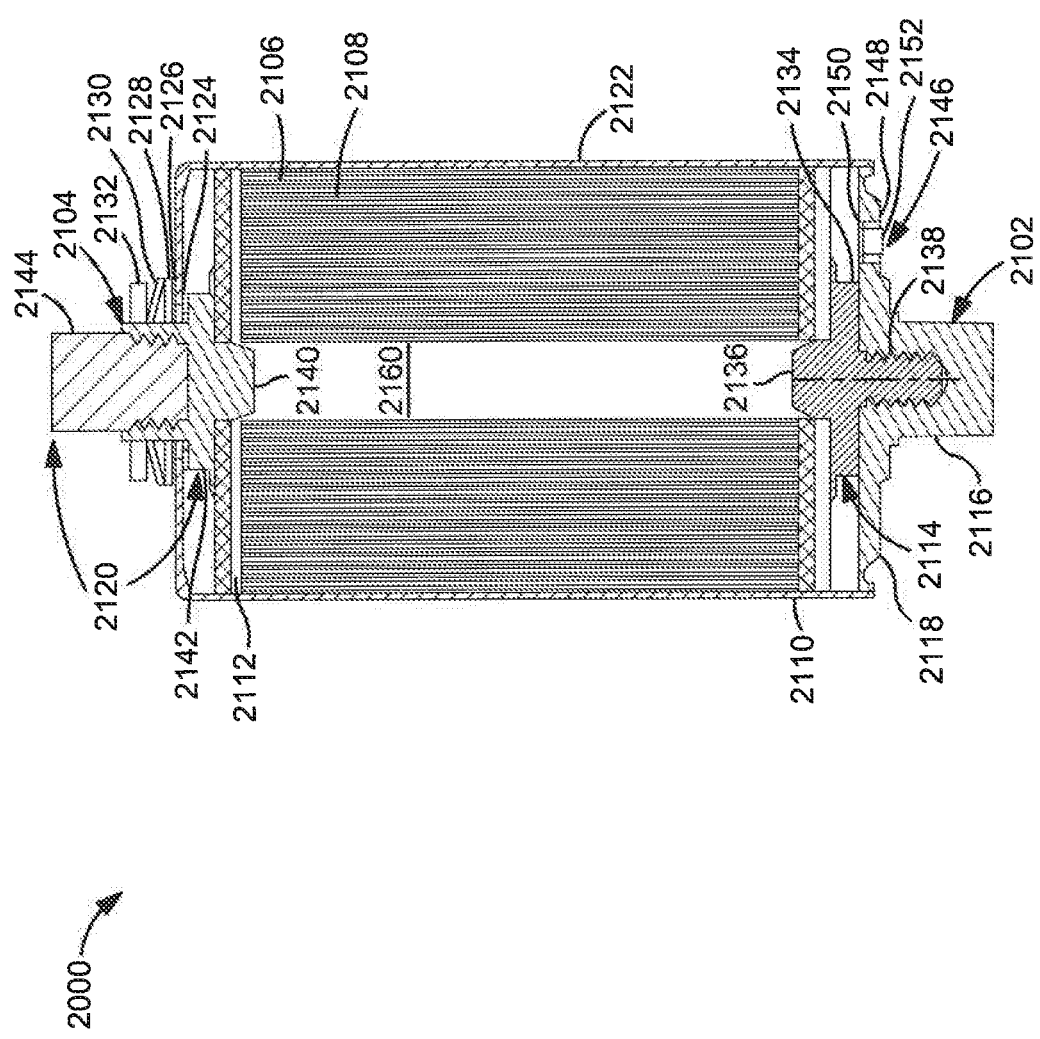
FIG. 3 is a schematic view of one embodiment of a supercapacitor in accordance with aspects of the present invention.

The electrode assembly may be sealed within the cylindrical housing using a variety of different techniques. Referring to FIG. 3, one embodiment of an supercapacitor 2000 is shown that contains an electrode assembly 2108, which contains layers 2106 wound together in a jellyroll configuration. In this particular embodiment, the supercapacitor contains a first collector disc 2114, which contains a disc-shaped portion 2134, a stud portion 2136, and a fastener 2138 (e.g., screw). The collector disc 2114 is aligned with a first end of a hollow core 2160, which is formed in the center of the electrode assembly, and the stud portion 2136 is then inserted into an opening of the core so that the disc-shaped portion 2134 sits against the first end of the electrode assembly 2108 at a first contact edge 2110. A lid 2118 is welded (e.g., laser welded) to a first terminal post 2116, and a socket, which may be for example, threaded, is coupled to the fastener 2138. The supercapacitor also contains a second collector disc 2120, which contains a disc-shaped portion 2142, a stud portion 2140, and a second terminal post 2144. The second collector disc 2120 is aligned with the second end of the hollow core 2160, and the stud portion 2140 is then inserted into the opening of the core so that the collector disc portion 2142 sits against the second end of the electrode assembly 2108.

A metal container 2122 (e.g., cylindrically-shaped can) is thereafter slid over the electrode assembly 2108 so that the second collector disc 2120 enters the container 2122 first, passes through a first insulating washer 2124, passes through an axial hole at an end of the container 2122, and then passes through a second insulating washer 2126. The second collector disc 2120 also passes through a flat washer 2128 and a spring washer 2130. A locknut 2132 is tightened over the spring washer 2130, which compresses the spring washer 2130 against the flat washer 2128, which in turn is compressed against the second insulating washer 2126. The second insulating washer 2126 is compressed against the exterior periphery of the axial hole in the metal container 2122, and as the second collector disc 2120 is drawn by this compressive force toward the axial hole, the first insulating washer 2124 is compressed between the second collector disc 2120 and an interior periphery of the axial hole in the container 2122. A flange on the first insulating washer 2124 inhibits electrical contact between the second collector disc 2120 and a rim of the axial hole. Simultaneously, the lid 2118 is drawn into an opening of the container 2122 so that a rim of the lid 2118 sits just inside a lip of the opening of the container 2122. The rim of the lid 2118 is then welded to the lip of the opening of the container 2122.

Once the locknut 2132 is tightened against the spring washer 2130, a hermetic seal may be formed between the axial hole, the first insulating washer 2124, the second insulating washer 2126, and the second collector disc 2120. Similarly, the welding of the lid 2118 to the lip of the container 2122, and the welding of the lid 2118 to the first terminal post 2116, may form another hermetic seal. A hole 2146 in the lid 2118 can remain open to serve as a fill port for the electrolyte described above. Once the electrolyte is in the can (i.e., drawn into the can under vacuum, as described above), a bushing 2148 is inserted into the hole 2146 and seated against a flange 2150 at an interior edge of the hole 2146. The bushing 2148 may, for instance, be a hollow cylinder in shape, fashioned to receive a plug 2152. The plug 2152, which is cylindrical in shape, is pressed into a center of the bushing 2148, thereby compressing the bushing 2148 against an interior of the hole 2146 and forming a hermetic seal between the hole 2146, the bushing 2148, and the plug 2152. The plug 2152 and the bushing 2148 may be selected to dislodge when a prescribed level of pressure is reached within the supercapacitor, thereby forming an overpressure safety mechanism.

The embodiments described above generally refer to the use of a single electrochemical cell in the capacitor. It should of course be understood, however, that the capacitor of the present invention may also contain two or more electrochemical cells. In one such embodiment, for example, the capacitor may include a stack of two or more electrochemical cells, which may be the same or different.

The resulting supercapacitor can exhibit excellent electrical properties. For example, the supercapacitor may exhibit a capacitance of about 6 Farads per cubic centimeter ("$F/cm^3$") or more, in some embodiments about 8 $F/cm^3$ or more, in some embodiments from about 9 to about 100 $F/cm^3$, and in some embodiments, from about 10 to about 80 $F/cm^3$, measured at a temperature of 23° C., frequency of 120 Hz, and without an applied voltage. The supercapacitor may also have a low equivalence series resistance (ESR), such as about 150 mohms or less, in some embodiments less than about 125 mohms, in some embodiments from about 0.01 to about 100 mohms, and in some embodiments, from about 0.05 to about 70 mohms, determined at a temperature of 23° C., frequency of 100 kHz, and without an applied voltage.

Notably, the supercapacitor may also exhibit excellent electrical properties even when exposed to high temperatures. For example, the supercapacitor may be placed into contact with an atmosphere having a temperature of from about 80° C. or more, in some embodiments from about 100° C. to about 150° C., and in some embodiments, from about 105° C. to about 130° C. (e.g., 85° C. or 105° C.). The capacitance and ESR values can remain stable at such temperatures for a substantial period of time, such as for about 100 hours or more, in some embodiments from about 300 hours to about 5000 hours, and in some embodiments, from about 600 hours to about 4500 hours (e.g., 168, 336, 504, 672, 840, 1008, 1512, 2040, 3024, or 4032 hours).

In one embodiment, for example, the ratio of the capacitance value of the supercapacitor after being exposed to the hot atmosphere (e.g., 85° C. or 105° C.) for 1008 hours to the capacitance value of the supercapacitor when initially exposed to the hot atmosphere is about 0.75 or more, in some embodiments from about 0.8 to 1.0, and in some embodiments, from about 0.85 to 1.0. Such high capacitance values can also be maintained under various extreme conditions, such as when applied with a voltage and/or in a humid atmosphere. For example, the ratio of the capacitance value of the supercapacitor after being exposed to the hot atmosphere (e.g., 85° C. or 105° C.) and an applied voltage to the initial capacitance value of the supercapacitor when exposed to the hot atmosphere but prior to being applied with the voltage may be about 0.60 or more, in some embodiments from about 0.65 to 1.0, and in some embodiments, from about 0.7 to 1.0. The voltage may, for instance, be about 1 volt or more, in some embodiments about 1.5 volts or more, and in some embodiments, from about 2 to about 10 volts (e.g., 2.1 volts). In one embodiment, for example, the ratio noted above may be maintained for 1008 hours or more. The supercapacitor may also maintain the capacitance values noted above when exposed to high humidity levels, such as when placed into contact with an atmosphere having a relative humidity of about 40% or more, in some embodiments about 45% or more, in some embodiments about 50% or more, and in some embodiments, about 70% or more (e.g., about 85% to 100%). Relative humidity may, for instance, be determined in accordance with ASTM E337-02, Method A (2007). For example, the ratio of the capacitance value of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 0.7 or more, in some embodiments from about 0.75 to 1.0, and in some embodiments, from about 0.80 to 1.0. In one embodiment, for example, this ratio may be maintained for 1008 hours or more.

The ESR can also remain stable at such temperatures for a substantial period of time, such as noted above. In one embodiment, for example, the ratio of the ESR of the supercapacitor after being exposed to the hot atmosphere (e.g., 85° C. or 105° C.) for 1008 hours to the ESR of the supercapacitor when initially exposed to the hot atmosphere is about 1.5 or less, in some embodiments about 1.2 or less, and in some embodiments, from about 0.2 to about 1. Notably, such low ESR values can also be maintained under various extreme conditions, such as when applied with a high voltage and/or in a humid atmosphere as described above. For example, the ratio of the ESR of the supercapacitor after being exposed to the hot atmosphere (e.g., 85° C. or 105° C.) and an applied voltage to the initial ESR of the supercapacitor when exposed to the hot atmosphere but prior to being applied with the voltage may be about 1.8 or less, in some embodiments about 1.7 or less, and in some embodiments, from about 0.2 to about 1.6. In one embodiment, for example, the ratio noted above may be maintained for 1008 hours or more. The supercapacitor may also maintain the ESR values noted above when exposed to high humidity levels. For example, the ratio of the ESR of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 1.5 or less, in some embodiments about 1.4 or less, and in some embodiments, from about 0.2 to about 1.2. In one embodiment, for example, this ratio may be maintained for 1008 hours or more.

III. Supercapacitor Matching.

In some embodiments, the supercapacitor module may include a plurality of supercapacitors. The supercapacitors may be matched such that a balancing circuit is not needed to regulate the respective voltages across each of the supercapacitors. In some embodiments, the supercapacitors may be matched based on one or more characteristics, such as direct current leakage (DCL), equivalent series resistance (ESL), capacitance, and/or any other suitable characteristics, as explained in greater detail below.

In one embodiment, the capacitor module may include a first supercapacitor having a first parameter value for a capacitor parameter in a first test condition. The capacitor module may also include a second supercapacitor having a second parameter value for the capacitor parameter at about the first test condition. The first test condition may include various testing condition parameters, such as temperature, humidity, direct current (DC) voltage, alternating current (AC) voltage, hours of prior use and/or the like, as explained in greater detail below. As indicated above, capacitor parameters may include direct current leakage, equivalent series resistance, and/or capacitance direct current leakage, also referred to as "leakage current," is the amount of current which flows through the capacitor at a given DC voltage, for example at the rated DC voltage of the supercapacitor. Additionally, any suitable characteristic of a capacitor may be a capacitor parameter.

In some embodiments, a ratio of the second parameter value to the first parameter value may be from about 0.8 to about 1.2. In some embodiments, the ratio may be from about 0.85 to about 1.15, and in some embodiments from about 0.9 to about 1.1, and in some embodiments from about 0.95 to about 1.05, and in some embodiments from about 0.975 to about 1.025, and in some embodiments from 0.99 to 1.01, and in some embodiments from 0.995 to 1.005.

In some embodiments, matching the supercapacitors may eliminate the need for a voltage balancing circuit. As indicated above, balancing circuits may control the respective voltages across each supercapacitor to prevent overvoltages. Balancing circuits may be active, such as an integrated circuit, or passive, such as one or more passive components (e.g., resistors) connecting the terminals of the supercapacitors. By matching the supercapacitors as described herein, the module may operate with approximately equal voltages across each supercapacitor. This may prevent overvoltages from occurring, thus eliminating the need for a balancing circuit in some embodiments.

In some embodiments, the first capacitor may be connected in series with the second supercapacitor without an active or passive balancing circuit. In some embodiments, a simple passive balancing circuit may be used, while an active balancing circuit may be excluded. In other embodiments, the first supercapacitor may be connected in series with the second supercapacitor using a simplified active balancing circuit. For example, the simplified active balancing circuit may contain fewer components, consume less energy, cost less to produce, and/or generate less heat than a standard active balancing circuit.

Although explained above with reference to two supercapacitors, as indicated above, the module may contain any suitable number of supercapacitors, such as described above. In some embodiments, additional supercapacitors beyond the first and second supercapacitors may be selected based on comparison with the first supercapacitor using the methods described herein. For example, each additional supercapacitor may have a respective parameter value for the capacitor parameter at about the first test condition. Each additional supercapacitor may be selected based on the ratio of the capacitor parameter value in the first test condition for the respective additional supercapacitor being from about 0.8 to about 1.2 times the capacitor parameter value for the first capacitor parameter value for the capacitor parameter in the first test condition. In other embodiments, the ratio being within any of the other ratio ranges discussed herein.

In some embodiments, each supercapacitor may be compared only with supercapacitors to which it is directly connected. For example, each $n^{th}$ supercapacitor may be compared with supercapacitors n−1, n+1, or both. In some embodiments, each supercapacitor may be selected as the module is assembled based on the last supercapacitor that was added to the module i.e., supercapacitor n−1. In some embodiments, the capacitor parameter for each $n^{th}$ supercapacitor may also be compared to a nominal goal capacitor parameter. In other embodiments, the supercapacitors may be selected using any statistical analysis technique, machine learning algorithm, and/or optimization algorithm. For example, in one embodiment the supercapacitors may be selected such that the standard deviation(s) of one or more capacitor parameters is within one or more respective predetermined standard deviation ranges.

In some embodiments, empirical analysis may be combined with other methods described herein to match the supercapacitors. For example, a test voltage may be applied across a first supercapacitor. Next, several supercapacitors may be "auditioned" to determine which supercapacitor should be added to the module as the second supercapacitor. This may include connecting, one at a time, each "auditioning" supercapacitor in series with the first supercapacitor. While a voltage is applied across the series of supercapacitors, the voltage across the first supercapacitor and the voltage across the auditioning supercapacitor may be measured and the mathematical difference computed. The "auditioning" supercapacitor resulting in the smallest mathematical difference between the voltage across the first supercapacitor and the voltage across the "auditioning" supercapacitor may then be selected as the second supercapacitor. The process may then be repeated to select the third supercapacitor, fourth supercapacitor, and so on. Additionally, the above described process may aid in determining the optimal order in which to connect the supercapacitors in the module.

In other embodiments, any suitable optimization algorithm may be used to theoretically determine the selection and/or connection order of potential supercapacitors for a module. For example, the empirical selection procedure described above may be theoretically simulated using known characteristics of the potential supercapacitors and theoretical or empirical relationships between the characteristics of the supercapacitors, the associated testing conditions, and the resulting voltages across the supercapacitors when connected in a module. In other embodiments, given a possible pool of potential supercapacitors, each possible combination and/or order of supercapacitors may be theoretically modeled to determine the most suitable combination and connection order to minimize voltage discrepancy and/or overvoltages in the module.

In other embodiments, when selecting a plurality of supercapacitors for a module, several capacitor parameters may be measured for each supercapacitor. The supercapacitors may then be ranked based on the capacitor parameters. For example, in some embodiments, the supercapacitors may be ranked first by the capacitor parameter determined to be most predictive of the interaction of the supercapacitors within the module. The supercapacitors may then be ranked next by the next most predictive capacitor parameter, and so forth. In other embodiments, each capacitor parameter may be given a weight, and the supercapacitors may then be ranked according to a weighted average of the capacitor parameters. The weights may be based on how determinative the respective capacitor parameter is of the voltage across the supercapacitor once connected in a module. The selection and/or connection order of the supercapacitors may be selected based on the resulting ranking.

IV. Selection Based on Direct Current Leakage (DCL)

In some embodiments, the supercapacitors may be selected based on DCL. For example, the first supercapacitor may have a DCL of 25 microamps (uA) in the first test condition. In some embodiments, the first test condition may include a temperature, relative humidity, an applied DC voltage, and/or an applied AC voltage at a constant frequency. For example, the first test condition may include an applied DC voltage of 5 volts (with no AC voltage component) at a temperature of 25° C. The second supercapacitor may be selected based on having a DCL from about 0.9 to about 1.1 times the DCL of the first supercapacitor in about the first test condition. Thus, in this example, the second supercapacitor may have a DCL from 22.5 uA to 27.5 uA at an applied DC voltage of 5 volts (with no AC voltage component) and at a temperature of 25° C. For example, the supercapacitors may be selected based on DCL testing using one of the test methods described in the following section.

In another embodiment, the first supercapacitor may be selected as described above, and the second supercapacitor may be selected based on having a DCL from about 0.95 to about 1.05 times the DCL of the first supercapacitor at about the same voltage and about the same temperature. Thus, in this example, the second supercapacitor may have a DCL from about 23.75 uA to about 26.25 uA at about 5 volts and about 25° C.

In another embodiment, the first supercapacitor may be selected as described above, and the second supercapacitor may be selected based on having a DCL from about 0.975 to about 1.025 times the DCL of the first supercapacitor at about the same voltage and about the same temperature. Thus, in this example, the second supercapacitor may have a DCL between about 24.375 uA and about 25.625 uA at about 5 volts and about 25° C.

In another embodiment, the first supercapacitor may be selected as described above, and the second supercapacitor may be selected based on having a DCL from about 0.99 to about 1.01 times the DCL of the first supercapacitor at about the same voltage and about the same temperature. Thus, in this example, the second supercapacitor may have a DCL from about 24.75 uA to about 25.25 uA at about 5 volts and about 25° C.

V. Selection Based on Equivalent Series Resistance (ESR)

In some embodiments, the supercapacitors may be selected based on ESR. In some embodiments, the ESR may be for an alternating current ($ESR_{AC}$), and in other embodiments, the ESR may be for a direct current ($ESR_{DC}$). For example, the supercapacitors may be selected based on ESR testing using one of the test methods described in the following section.

For example, the first supercapacitor may have an $ESR_{AC}$ of 65 mohms in the first test condition. In some embodiments, the first test condition may include a temperature, relative humidity, an applied DC voltage, and/or an applied AC voltage at a constant frequency. For example, the first test condition may include an AC voltage of 10 millivolts (mV) at 1 kHz (with a DC bias voltage of 0.0 volts), and a temperature of 25° C. In other embodiments, the DC bias voltage may be 1.1 volts or 2.1 volts, for example. The second supercapacitor may be selected based on having an $ESR_{AC}$ from about 0.9 to about 1.1 times the $ESR_{AC}$ of the first supercapacitor in about the first test condition. Thus, in this example, the second supercapacitor may have an $ESR_{AC}$ from about 58.5 mohms to about 71.5 mohms at about 10 mV at about 1 kHz (DC bias of 0.0 volts), and at a temperature of about 25° C.

In another embodiment, the first supercapacitor may be selected as described above, and the second supercapacitor may be selected based on having an $ESR_{AC}$ from about 0.95 to about 1.05 times the $ESR_{AC}$ of the first supercapacitor in about the first test condition. Thus, in this example, the second supercapacitor may have an $ESR_{AC}$ from about 61.75 mohms to about 68.25 mohms at about 10 mV (DC bias of 0.0 volts) at about 1000 Hz, and about 25° C.

In another embodiment, the first supercapacitor may be selected as described above, and the second supercapacitor may be selected based on having an $ESR_{AC}$ from about 0.975 to about 1.025 times the $ESR_{AC}$ of the first supercapacitor in about the first test condition. Thus, in this example, the second supercapacitor may have an $ESR_{AC}$ from about 63.375 mohms to about 66.625 mohms at about 10 mV (DC bias of 0.0 volts) at about 1000 Hz, and about 25° C.

In another embodiment, the first supercapacitor may be selected as described above, and the second supercapacitor may be selected based on having an $ESR_{AC}$ from about 0.99 to about 1.01 times the $ESR_{AC}$ of the first supercapacitor in about the first test condition. Thus, in this example, the second supercapacitor may have an $ESR_{AC}$ from about 64.350 mohms to about 65.650 mohms at about 10 mV (DC bias of 0.0 volts) at about 1000 Hz, and about 25° C.

VI. Selection Based on Capacitance

In some embodiments, the supercapacitors may be selected based on capacitance. For example, the first supercapacitor may have a capacitance of 5 Farads (F) in the first test condition. In some embodiments, the first test condition may include a temperature, relative humidity, an applied DC voltage, and/or an applied AC voltage at a constant frequency. For example, the first test condition may include a temperature of about 25° C. The second supercapacitor may be selected based on having a capacitance from about 0.9 to about 1.1 times the capacitance of the first supercapacitor in about the first test condition. Thus, in this example, the second supercapacitor may have a capacitance from about 4.5 F to about 5.5 F at a temperature of about 25° C. The supercapacitors may be selected based on capacitance testing using one of the test methods described in the following section.

In another embodiment, the first supercapacitor may be selected as described above, and the second supercapacitor may be selected based on having a capacitance from about 0.95 to about 1.05 times the capacitance of the first supercapacitor in about the first test condition. Thus, in this example, the second supercapacitor may have a capacitance from about 4.75 F to about 5.25 F at about 25° C.

In another embodiment, the first supercapacitor may be selected as described above, and the second supercapacitor may be selected based on having a capacitance from about 0.975 to about 1.025 times the capacitance of the first supercapacitor in about the first test condition. Thus, in this example, the second supercapacitor may have a capacitance from about 4.875 F to about 5.125 F at about 25° C.

In another embodiment, the first supercapacitor may be selected as described above, and the second supercapacitor may be selected based on having a capacitance from about 0.99 to about 1.01 times the capacitance of the first supercapacitor in about the first test condition. Thus, in this example, the second supercapacitor may have a capacitance from about 4.95 F to about 5.05 F at about 25° C.

VII. Selection Based on Multiple Parameters

In some embodiments, the supercapacitors may be selected based on combinations of two or more of the above parameters. For example, in one embodiment, the first supercapacitor may have both (1) a DCL of 25 microamps (uA) at an applied voltage of 5 volts (DC) (with no AC voltage component) and at temperature of 25° C. and (2) an ESR of 65 mohms at 10 millivolts (mV) at 1000 Hz (with no DC voltage bias), and at a temperature of 25° C. The second supercapacitor may be selected based on (1) a ratio of the DCL of the second supercapacitor in the first test condition to the DCL of the first supercapacitor being within a first ratio range (e.g., from about 0.8 to about 1.2), and (2) a second ratio of the ESR of the second supercapacitor in a second test condition to the ESR of the first supercapacitor in the second test condition being within a second ratio range (e.g., from about 0.95 to about 1.05). In some embodiments, the first ratio range may be equal to the second ratio range.

For example, in one embodiment, each of the first and second ranges may be from about 0.99 to about 1.01. In other embodiments, the first ratio range for DCL may be different than the second ratio range for ESR. For example, in one embodiment, the first ratio range for DCL may be from about 0.99 to about 1.01, and the second ratio range for ESR may be from about 0.95 to about 1.05.

It should be appreciated that any suitable combination of ratio ranges and parameters may be used. In some embodiments, the supercapacitors may be selected based on all three parameters (DCL, ESR, and capacitance). In other embodiments, additional parameters may be used, such as peak current, max energy, energy density, etc. Additionally, as indicated above, any suitable statistical analysis technique, machine learning algorithm, and/or optimization algorithm may be used. Although described as having two supercapacitors, it should be appreciated that the module may have any suitable number of supercapacitors, as indicated above. Moreover, the above explanation of selecting a second supercapacitor based on the first supercapacitor may similarly be applied to selecting a third supercapacitor based on the second supercapacitor, and so forth.

Figure 4A:
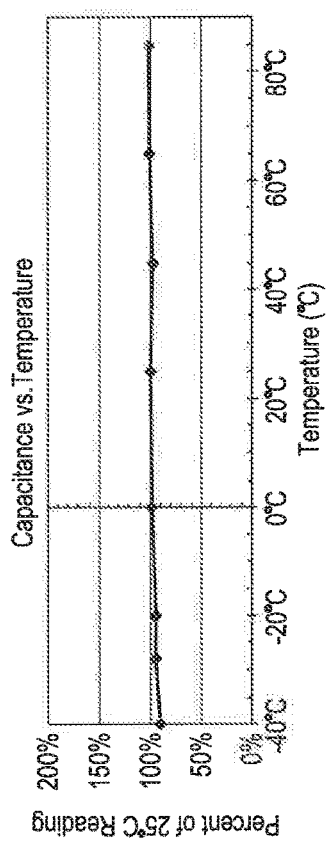
FIGS. 4*a*-4*c* illustrate relationships between temperature and capacitance, leakage current, and equivalent series resistance, respectively.
Figure 4B:
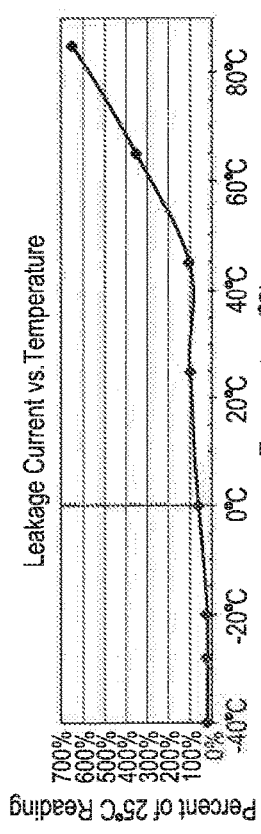
Figure 4C:
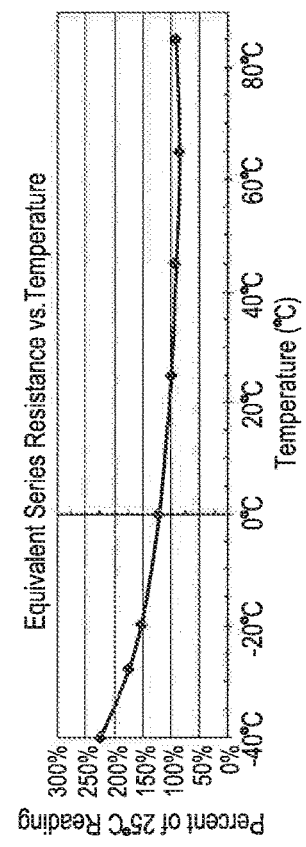

Referring to FIGS. 4a-4c, capacitance, leakage current, and equivalent series resistance, respectively, may vary with temperature. The relationship between each capacitor parameter and temperature may be empirically or theoretically determined. These relationships may be used to select supercapacitors as explained in greater detail below.

Figure 5:
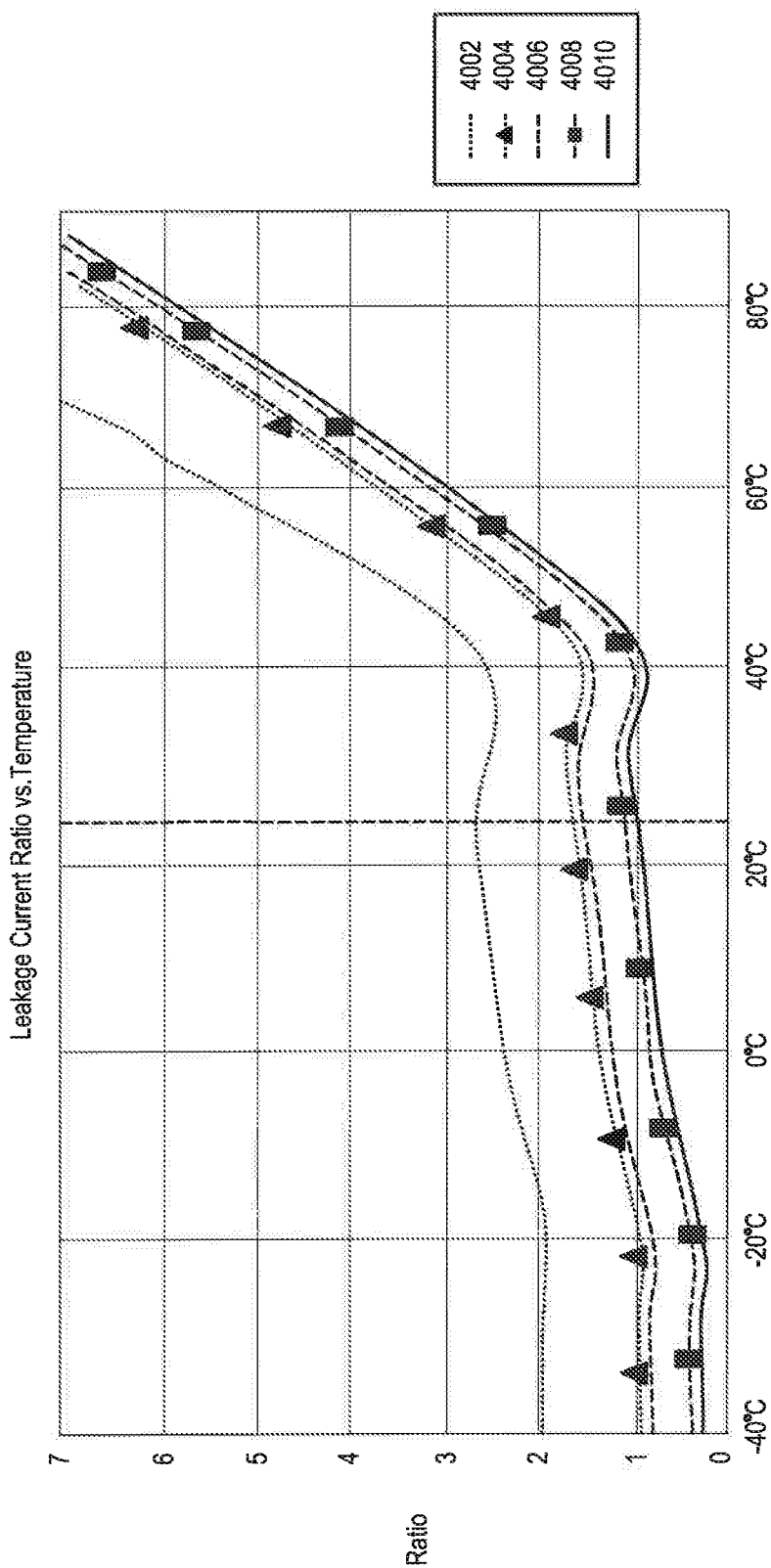
FIG. 5 illustrates a hypothetical example of selecting supercapacitors based on measuring leakage current.

For example, FIG. 5 illustrates a hypothetical example of testing and matching supercapacitors. In this hypothetical, a target range from about 0.8 to about 1.2 is used for the ratio of capacitor parameter values. FIG. 5 illustrates leakage current vs. temperature for five supercapacitors 4002, 4004, 4006, 4008, 4010. The leakage current of each supercapacitor may be measured at 25° C. (illustrated by the vertical dotted line at 25° C.). The ratio of the leakage currents for each supercapacitor may be calculated with respect to one of the supercapacitors. For example, the ratio may be calculated with respect to supercapacitor 4010 because supercapacitor 4010 has the lowest leakage current at 25° C. The ratio of the leakage current at 25° C. for supercapacitor 4008 to the leakage current at 25° C. for supercapacitor 4010 is approximately 1.1, which is within the target range of 0.8 to 1.2. Thus, in this hypothetical example, supercapacitors 4008 and 4010 may be matched to form a module. FIG. 5 illustrates that the leakage current ratio for these supercapacitors 4008, 4010 is predicted to remain within this range for all temperatures within the −40° C. to 80° C. This matching may provide a module for which the leakage current of the supercapacitors is approximately equal despite changes in temperature. In turn, this may automatically regulate the respective voltages across each supercapacitor such that no overvoltages occur. FIG. 5 may also indicate that another module may be formed using supercapacitors 4004, 4006. It should be understood that this hypothetical example is applicable to forming modules having more than supercapacitors.

In some embodiments, the relationships between capacitor parameters (e.g., leakage current) and test conditions (e.g., temperature) used to match supercapacitors. For example, in some embodiments supercapacitors may be matched based on measurements taken under different test conditions. For example, the leakage current of the second supercapacitor may be tested at a different temperature than the first supercapacitor, which is tested in the first test condition. The known relationship between the capacitor parameter and temperature may be used to estimate the second parameter value for the second supercapacitor in about the first test condition such that the second supercapacitor may be matched to the first supercapacitor based on the available data.

For example, referring to FIG. 5, the leakage current of supercapacitor 4008 may be known at 80° C. and the leakage current of supercapacitor 4010 may be known at 25° C. Using the relationship between leakage current and temperature illustrated in FIG. 5, the leakage current for supercapacitor 4008 may be estimated at 25° C. This estimated value may be then be used to determine whether the second supercapacitor is an appropriate match for the first supercapacitor.

Similarly, in some embodiments, the relationship between different capacitor parameters may be determined such that supercapactiors may be matched based on capacitor parameter values for different capacitor parameters. For example, leakage current may be empirically or theoretically correlated with equivalent series resistance. This correlation may be used to match a first supercapacitor for which leakage current is known in a first condition with a second supercapacitor for which ESR is known in a second condition.

In some embodiments, supercapacitors may be matched using two or more capacitor parameters using statistical analysis and/or machine learning. For example, referring to FIG. 6, in one embodiment, data for a plurality of supercapacitors, any suitable clustering algorithm or machine learning model may be used to locate groups of supercapacitors having similar capacitor parameters. For example, in FIG. 6, "capacitor parameter 1" may be capacitance measured in a first test condition and "capacitor parameter 2" may be leakage current measured in about the first test condition. The algorithm may group the supercapacitors into several groups which contain similar supercapacitors. Although illustrated for two capacitor parameters, in some embodiments, the clustering algorithm may be configured to create clusters of supercapacitors based on three or more capacitor parameters. Examples of inputs for the clustering algorithm include the ratio of capacitor parameter values discussed herein, the desired number of supercapacitors per module, desired overall properties of the module (e.g., overall capacitance, ESR, and DCL).

As indicated above, in some embodiments, a machine learning model may be used to match supercapacitors. For example, the model may be trained using the example data illustrated in FIG. 6 and configured to predict and optimize the resulting respective voltages across individual supercapacitors in theoretical modules. For example, a training set of data may be created by monitoring the respective voltages across individual supercapacitors in various modules of different sizes, capacitances, etc. These monitored voltages, combined with known capacitor parameter values for the respective supercapacitors within the modules may be used as a training data set such that the machine learning model may be configured to minimize voltage discrepancies and/or overvoltages when clustering or grouping supercapacitors based on capacitor parameter values.

The present invention may be better understood with reference to the following example.

TEST METHODS

The following sections provide example methods for testing supercapacitors to determine various capacitor parameters. The capacitor parameters may be tested using any suitable method, however. Moreover, some capacitor parameters may vary from when the supercapacitor is initially formed. Thus, the capacitor parameters may be measured after an initial test time. For example, in some embodiments, testing may be conducted after an initial test time of 20 hours to 150 hours, in some embodiments between 40 and 130 hours, in some embodiments between 50 and 110 hours, e.g., 72 hours.

Additionally, testing may be conducted at a variety of temperature and relative humidity levels. For example, the temperature may be room temperature (~23° C.), 25° C., 85° C., 01105° C., and the relative humidity may be 25% or 85%.

I. Direct Current Leakage (DCL)

Direct current leakage may be measured across a resistor using a Keithley 2400, 2602, or 3330 Precision LCZ meter. The direct current leakage of the supercapacitor may be measured by charging the supercapacitor to 5 volts for 72 hours at 25° C. and 25% relative humidity. Next, the supercapacitor may be connected in series with a resistor having a known resistance of 1000 ohms. The current flowing from the supercapacitor through the resistor may be allowed to stabilize for 10 minutes, and then the voltage across the resistor may be measured. The DCL may then be calculated using Ohm's law as the voltage across the resistor divided by the known resistance of the resistor.

II. Equivalent Series Resistance (ESR)

Equivalence series resistance for alternating current ($ESR_{AC}$) may be measured using a Keithley 2400, 2602, or 3330 Precision LCZ meter with a DC bias of 0.0 volts, 1.1 volts, or 2.1 volts (0.5 volt peak-to-peak sinusoidal signal). The operating frequency is 1 kHz.

Equivalence series resistance for direct current ($ESR_{DC}$) may be measured by cyclically charging and then discharging the supercapacitor at a constant current between (1) the rated voltage of the supercapacitor and (2) one half of the rated voltage of the supercapacitor. An equivalent series resistance value may be calculated for each of these charging and discharging steps based on respective current flow and voltages associated with each step. The $ESR_{DC}$ value may then be calculated by averaging the resistance values calculated in the previous steps.

III. Capacitance

The capacitance of the supercapacitors may be measured using a Keithley 2400, 2602, or 3330 Precision LCZ meter with a DC bias of 0.0 volts, 1.1 volts, or 2.1 volts (0.5 volt peak-to-peak sinusoidal signal). The operating frequency is 120 Hz. The temperature is room temperature (~23° C.) and relative humidity is 25%.

Alternatively, the supercapacitor may be charged using a voltage source to the rated voltage of the supercapacitor at a known temperature and humidity. For example, the supercapacitor may be charged to the rated voltage at room temperature at 25% relative humidity. The supercapacitor may then be disconnected from the voltage source, and the supercapacitor may be discharged at a constant current while the time required to discharge the supercapacitor from a first voltage to a second voltage is measured. The capacitance may then be calculated based on the first voltage, second voltage, and elapsed time.

EXAMPLE

The ability to form matched supercapacitor modules which operate satisfactorily without using a balancing circuit was demonstrated. Pairs of supercapacitors were matched based on similar DCL values and connected in series to form modules.

The resulting modules had a rated voltage of 5.0 volts, rated capacitance of 5 F at room temperature, and a rated $ESR_{AC}$ of 65 mohms at 1000 hz and 10 mV (0.0 DC bias voltage). The modules were tested at 100%, 90%, 80%, and 70% of the rated voltage of the modules, which correspond to 5.0 volts, 4.5 volts, 4.0 volts, and 3.5 volts, respectively. The testing was conducted at an operating temperature of 85° C. Each group of modules was cycled between the respective test voltage of the group, as indicated above, and one half of the respective test voltage under constant current at 85° C.

Satisfactory operating limits were defined for both capacitance and ESR. Specifically, meeting the satisfactory operating limits required both that (1) the capacitance remain at or above 70% of the rated capacitance at 85° C., and (2) the ESR remain at or below 300% of the rated ESR at 85° C.

The test results indicated that the modules satisfactorily remained within the above operating limits for over 3,000 hours at 4 volts and remained within the above operating limits for over 4,000 hours at 3.5 volts without using any balancing circuitry.

Figure 7B:
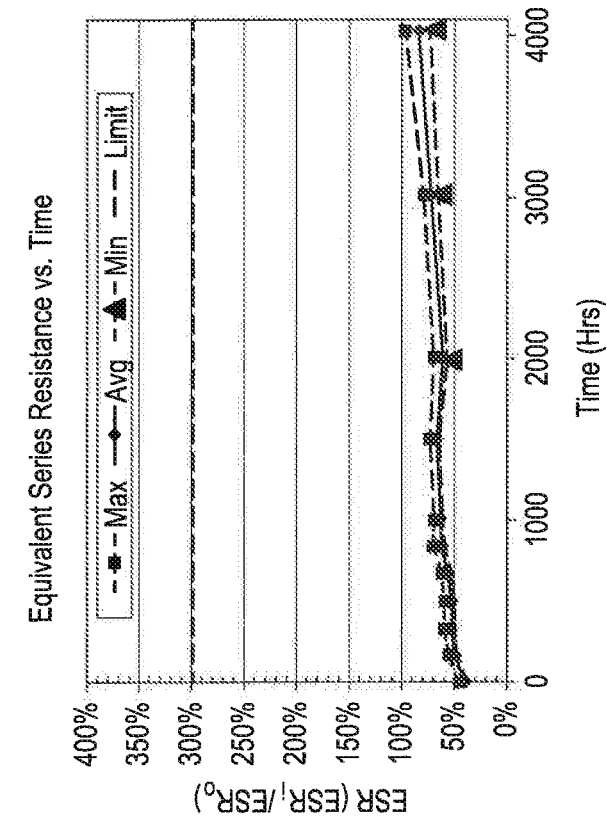
FIGS. 7*a* and 7*b* are plots of experimental test data.
Figure 7A:
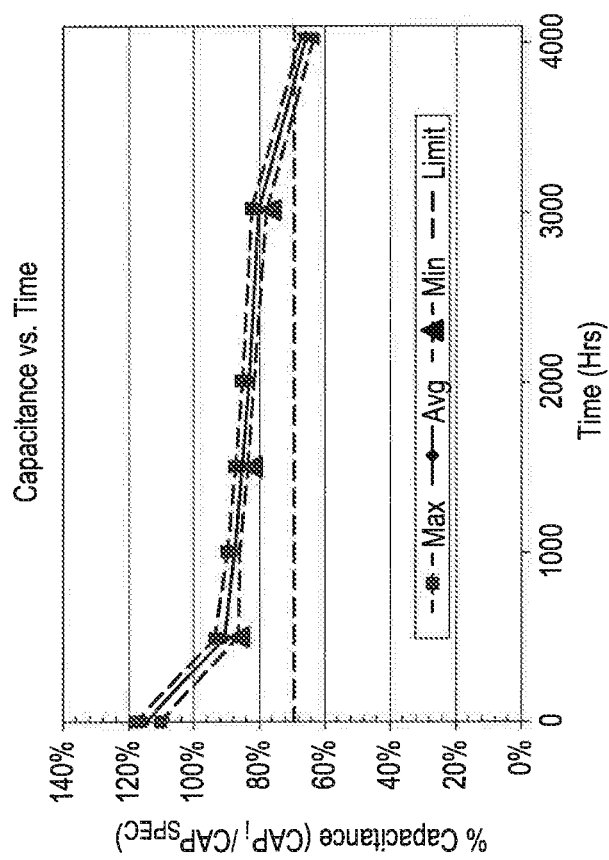

FIGS. 7a and 7b illustrate that the modules tested at 4 volts and 85° C. satisfactorily met the operating limits for over 3,000 hours without using balancing circuitry. Specifically, referring to FIG. 7a, the average capacitance of the modules remained above 70% of the rated capacitance ($CAP_{SPEC}$) for over 3,000 hours. However, at approximately 3,500 hours the capacitance fell below the 70% threshold. Referring to FIG. 7b, the average ESR of the modules remained well below 300% of the rated ESR ($ESR_O$) for the entire test period.

Figure 8B:
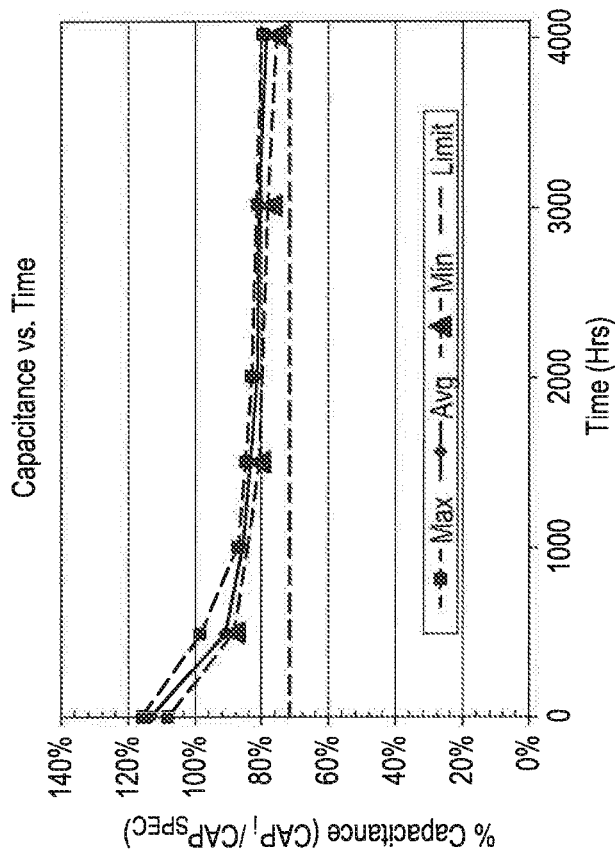
FIGS. 8*a* and 8*b* are plots of experimental test data for one embodiment of a supercapacitor module under a second set of test conditions.
Figure 8A:
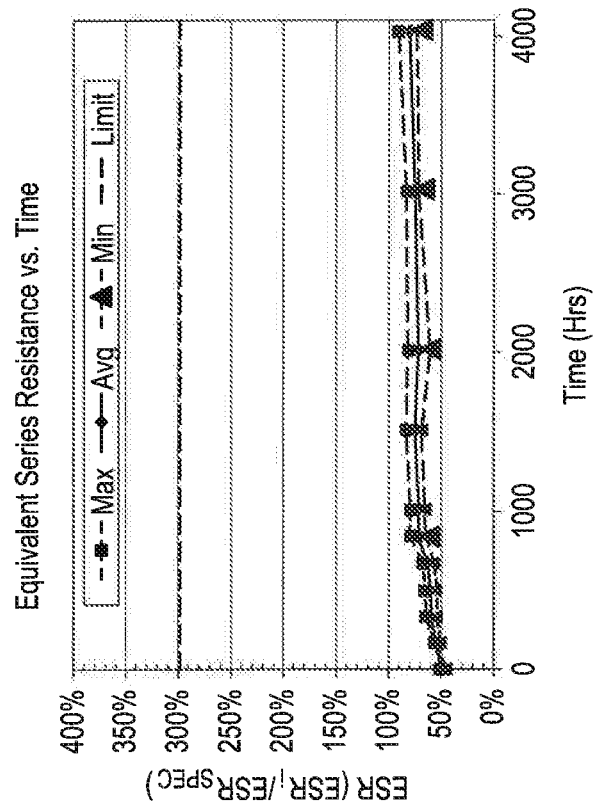

FIGS. 8a and 8b illustrate that the modules tested at 3.5 volts and 85° C. satisfactorily met the operating limits for 4,000 hours without using a balancing circuit. Specifically, referring to FIG. 8a, the average capacitance of the modules remained above 70% of the rated capacitance for 4,000 hours. Additionally, referring to FIG. 8b, the average ESR of the modules remained well below 300% of the rated ESR for 4,000 hours.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A supercapacitor module comprising:
   a first supercapacitor having a first parameter value for a capacitor parameter in a first test condition;
   a second supercapacitor having a second parameter value for the capacitor parameter in about the first test condition, a ratio of the second parameter value to the first parameter value being from about 0.8 to about 1.2; and
   wherein the supercapacitor module does not include a voltage balancing circuit.

2. The supercapacitor module of claim 1, wherein the ratio of the second parameter value to the first parameter value is from about 0.85 to about 1.15.

3. The supercapacitor module of claim 1, wherein the ratio of the second parameter value to the first parameter value is from about 0.9 to about 1.1.

4. The supercapacitor module of claim 1, wherein the capacitor parameter is a leakage current.

5. The supercapacitor module of claim 4, wherein the leakage current is greater than about 23.75 microamps and less than about 26.25 microamps at an applied DC voltage of about 5 volts and a temperature of about 25° C.

6. The supercapacitor module of claim 1, wherein the capacitor parameter is an equivalent series resistance.

7. The supercapacitor module of claim 6, wherein the equivalent series resistance is greater than about 61.75 mohms and less than about 68.25 mohms at an applied AC voltage of about 10 mV at a frequency of about 1000 Hz and at a temperature of about 25° C.

8. The supercapacitor module of claim 1, wherein the capacitor parameter is a capacitance.

9. The supercapacitor module of claim 8, wherein the capacitance is greater than about 4.75 F and less than about 5.25 F at a temperature of about 25° C.

10. The supercapacitor module of claim 1, wherein the first test condition includes a test voltage.

11. The supercapacitor module of claim 1, wherein the first test condition includes a test temperature.

12. The supercapacitor module of claim 1, wherein the first supercapacitor is connected in series with the second supercapacitor.

13. The supercapacitor module of claim 1, wherein:
the first supercapacitor has a third parameter value for a second capacitor parameter in a second test condition;
the second supercapacitor has a fourth parameter value for the second capacitor parameter in about the second test condition; and
a second ratio of the fourth parameter value to the third parameter value is from about 0.8 to about 1.2.

14. A method for manufacturing a supercapacitor module from a first supercapacitor and a second supercapacitor, the first supercapacitor having a first parameter value for a capacitor parameter in a first test condition, the method comprising:

selecting the second supercapacitor based on the second capacitor having a second parameter value for the capacitor parameter in about the first test condition, a ratio of the second parameter value to the first parameter value being from about 0.8 to about 1.2; and
enclosing the first and second supercapacitors in a housing without a balancing circuit.

15. The method of claim 14, wherein the capacitor parameter is a leakage current.

16. The method of claim 14, wherein the capacitor parameter is an equivalent series resistance.

17. The method of claim 14, wherein the capacitor parameter is a capacitance.

18. The method of claim 14, wherein a voltage across the first capacitor is not adjusted using a balancing circuit.

19. The method of claim 14, further comprising connecting the first supercapacitor in series with the second supercapacitor without a balancing circuit.

20. The method of claim 14, wherein the second ratio of the second parameter value to the first parameter value is from about 0.9 to about 1.1.

21. The method of claim 14, wherein the second ratio of the second parameter value to the first parameter value is from about 0.95 to about 1.05.

22. The method of claim 14, wherein:
the first supercapacitor has a third parameter value for a second capacitor parameter in a second test condition;
the second supercapacitor has a fourth parameter value for the second capacitor parameter at about the second test condition; and
selecting the second supercapacitor is further based on a second ratio of the fourth parameter value to the third parameter value being from about 0.8 to about 1.2.

* * * * *